(12) United States Patent
Li (10) Patent No.: US 9,875,944 B2
(45) Date of Patent: Jan. 23, 2018

(54) METHOD TO IMPROVE HCI PERFORMANCE FOR FINFET

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/348,705

(22) Filed: Nov. 10, 2016

(65) Prior Publication Data

US 2017/0243792 A1     Aug. 24, 2017

(30) Foreign Application Priority Data

Feb. 19, 2016    (CN) .......................... 2016 1 0091575

(51) Int. Cl.
    *H01L 21/336*        (2006.01)
    *H01L 29/78*         (2006.01)
                    (Continued)

(52) U.S. Cl.
    CPC ............... *H01L 21/823864* (2013.01); *H01L 21/823814* (2013.01); *H01L 21/823821* (2013.01);
                    (Continued)

(58) Field of Classification Search
    CPC ..... H01L 21/823814; H01L 21/823821; H01L 21/823864; H01L 27/0924; H01L 29/161;
                    (Continued)

(56) References Cited

U.S. PATENT DOCUMENTS

2014/0291737 A1    10/2014   Hafez et al.
2015/0001593 A1     1/2015   Kuo et al.
                    (Continued)

OTHER PUBLICATIONS

European Application No. 17155783.8, Extended European Search Report dated Jun. 21, 2017, 8 pages.

*Primary Examiner* — Daniel Shook
(74) *Attorney, Agent, or Firm* — Kilpatrick Townsend and Stockton LLP (57) ABSTRACT

A semiconductor device includes a substrate structure, multiple fins protruding from the substrate structure, each of the fins having a first portion, a second portion on opposite sides of the first portion, and a third portion at an outer side of the first portion and adjacent to the second portion, a gate structure on the upper surface of the first portion, sidewall spacers on opposite sides of the gate structure and covering the upper surface of the second portion, and source and drain regions outside of the sidewall spacers. The source and drain regions each have an upper surface higher than the second portion upper surface. The first portion protrudes from the second portion. The upper surface of the second portion is lower than the first portion upper surface. The upper surface of the third portion is lower than the second portion upper surface.

20 Claims, 9 Drawing Sheets

(51) Int. Cl.
  *H01L 21/8238* (2006.01)
  *H01L 27/092* (2006.01)
  *H01L 29/08* (2006.01)
  *H01L 29/161* (2006.01)
  *H01L 29/165* (2006.01)
  *H01L 29/24* (2006.01)
  *H01L 29/267* (2006.01)

(52) U.S. Cl.
  CPC ...... *H01L 27/0924* (2013.01); *H01L 29/0847* (2013.01); *H01L 29/161* (2013.01); *H01L 29/165* (2013.01); *H01L 29/24* (2013.01); *H01L 29/267* (2013.01); *H01L 29/7848* (2013.01)

(58) Field of Classification Search
  CPC ..... H01L 29/165; H01L 29/24; H01L 29/267; H01L 29/7848
  See application file for complete search history.

(56) References Cited

U.S. PATENT DOCUMENTS

2015/0206956 A1\* 7/2015 Kim .................. H01L 29/66795
  438/294
2015/0364574 A1 12/2015 Kim et al.
2015/0372143 A1\* 12/2015 Bae .................... H01L 29/7848
  257/401

\* cited by examiner

METHOD TO IMPROVE HCI PERFORMANCE FOR FINFET

CROSS-REFERENCES TO RELATED APPLICATIONS

This application claims priority to Chinese patent application No. 201610091575.8, filed on Feb. 19, 2016, the content of which is incorporated herein by reference in its entirety.

FIELD OF THE INVENTION

Embodiments of the disclosure relate to the field of semiconductor device fabrication. In particular, embodiments of the disclosure relate to a fin field effect transistor device having improved hot carrier reliability and method for manufacturing the same.

BACKGROUND OF THE INVENTION

Fin field-effect transistor (FinFET) devices have the ability to control short-channel effects, high drive current, low power consumption, and show promise to continue to follow Moore's Law. However, the hot-channel injection effect will adversely affect the reliability of FinFET devices. Currently, there is no effective techniques to suppress hot-channel injection (HCI) effects in FinFET devices.

Thus, there is a need for an improved FinFET structure and method for manufacturing the same to suppress HCI effects.

BRIEF SUMMARY OF THE INVENTION

Embodiments of the present invention provides a semiconductor device and method for manufacturing the same to suppress hot carrier effects.

According to some embodiments, a semiconductor device includes a substrate structure including a substrate, a plurality of semiconductor fins protruding from the substrate structure, each of the semiconductor fins comprising a first portion, a second portion on opposite sides of the first portion, and a third portion at an outer side of the first portion and adjacent to the second portion. the first portion protrudes from the second portion and has an upper surface, the second portion has an upper surface that is lower than the upper surface of the first portion, and the third portion has an upper surface that is lower than the upper surface of the second portion. The semiconductor device further includes a gate structure on the upper surface of the first portion, sidewall spacers on opposite sides of the gate structure and covering the upper surface of the second portion, and a source region and a drain region on the third portion and at an outer side of the sidewall spacers, the source and drain regions each having an upper surface higher than the upper surface of the second portion.

In one embodiment, the first portion comprises an epitaxial layer adjacent to the gate structure, and protrudes from the upper surface of the second portion.

In one embodiment, the plurality of fins comprises a first set of fins configured to form a plurality of NMOS transistor devices and a second set of fins configured to form a plurality of PMOS transistor devices. A portion of the first portion of the first set of fins protruding from the second portion includes an N-type conductive material, and a portion of the first portion of the second set of fins protruding from the second portion includes an N-type conductive material.

In another embodiment, a portion of the first portion of the first set of fins protruding from the second portion includes a P-type conductive material, and a portion of the first portion of the second set of fins protruding from the second portion includes an N-type conductive material.

In one embodiment, the semiconductor fins comprise silicon (Si) or silicon germanium (SiGe), the source and drain regions of the first set of fins include silicon phosphorus (SiP), and the source and drain regions of the second set of fins include SiGe.

In one embodiment, a portion of the first portion protruding from the second portion has a thickness in a range between 1 nm and 5 nm.

In one embodiment, the semiconductor fins comprise silicon or SiGe, and the source and drain regions comprise SiGe or SiP.

In one embodiment, the substrate structure further comprises a dielectric layer on the substrate, and the fins protrude from the dielectric layer.

In one embodiment, the semiconductor device further includes an interlayer dielectric layer on the substrate structure, and the interlayer dielectric layer surrounds the sidewall spacers and the gate structure.

In one embodiment, the gate structure includes a gate insulating layer on the first portion and a gate electrode on the gate insulating layer. The gate electrode includes polysilicon, metal or a conductive functional layer.

Embodiments of the present invention also provide a method for manufacturing a semiconductor device. The method may include providing a substrate structure including a substrate, forming a plurality of first fins having a semiconductor layer on the substrate, performing an epitaxial growth process on the semiconductor layer of the plurality of first fins to form a plurality of second fins having an epitaxial layer, forming a first gate insulating layer on the epitaxial layer, a gate material layer on the first gate insulating layer, and a hardmask layer on the gate material layer, performing a first etching process using a pattern mask to remove a portion of the hardmask layer, a portion of the gate material layer, and a portion of the first gate insulating layer to form a first structure and exposing a portion of the second fins not covered by the first structure, and performing a second etching process to remove at least the epitaxial layer in the exposed portion of the second fins to form a plurality of third fins, the third fins comprising a first portion of the semiconductor layer covered by the first structure. The method may further include forming sidewall spacers on the first structure, the sidewall spacers being disposed on an upper surface of a second portion of the third fins, the second portion being on opposite sides of the first portion and having an upper surface lower than an upper surface of the first portion. The method may also include performing a third etching process to form a third portion at an outer side of the first portion and adjacent to the second portion, the third portion having an upper surface lower than the upper surface of the second portion, and forming a source region and a drain region outside of the sidewall spacers and on the third portion. The source and drain regions each have an upper surface higher than the upper surface of the second portion.

In one embodiment, the method may also include forming an interlayer dielectric layer on the first structure, etching back the interlayer dielectric layer to expose the hardmask layer, removing the hardmask layer, the gate electrode, and the first gate insulating layer to form a trench, and forming a gate structure in the trench.

In one embodiment, the gate structure includes a second gate insulating layer on the first portion, and a second gate electrode on the second gate insulating layer.

In one embodiment, performing the second etching process to remove at least the epitaxial layer in the exposed portion of the second fins further includes removing a portion of the semiconductor layer below the epitaxial layer.

In one embodiment, the removed portion of the semiconductor layer has a thickness in a range between 1 nm and 3 nm.

In one embodiment, the fins includes a first set of fins configured to form a plurality of NMOS transistor devices and a second set of fins configured to form a plurality of PMOS transistor devices.

In one embodiment, the epitaxial growth process is an in-situ epitaxial growth process doped with phosphorus or arsenic.

In one embodiment, the epitaxial layer has a thickness in the range between 1 nm and 2 nm.

In one embodiment, the semiconductor layer includes silicon or SiGe, and the source and drain regions include SiGe or SiP.

In one embodiment, the semiconductor layer includes silicon or SiGe, the source and drain regions of the first set of fins include SiP, and the source and drain regions of the second set of fins include SiGe.

In one embodiment, the substrate structure further comprises a dielectric layer on the substrate, and the fins protrude from the dielectric layer.

In one embodiment, the semiconductor device further includes an interlayer dielectric layer on the substrate structure, and the interlayer dielectric layer surrounds the sidewall spacers and the gate structure.

In one embodiment, the gate structure includes a gate insulating layer on the first portion and a gate electrode on the gate insulating layer. The gate electrode includes polysilicon, metal or a conductive functional layer.

The following description, together with the accompanying drawings, will provide a better understanding of the nature and advantages of the claimed invention.

BRIEF DESCRIPTION OF THE DRAWINGS

The accompanying drawings, referred to herein and constituting a part hereof, illustrate embodiments of the invention. The drawings together with the description serve to explain the principles of the invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to perspective cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The use of the terms first, second, third, etc. do not denote any order, but rather the terms first, second, third, etc. are used to distinguish one element from another. Furthermore, the use of the terms a, an, etc. does not denote a limitation of quantity, but rather denote the presence of at least one of the referenced items.

The term "substrate" may include any structure having an exposed surface with which to form an integrated circuit. The term "substrate" is understood to include semiconductor wafers and is also used to refer to semiconductor structures during processing and may include other layers that have been fabricated thereupon. A "substrate" may include doped and undoped semiconductor wafers, epitaxial semiconductor layers, as well as other semiconductor structures.

Figure 1:
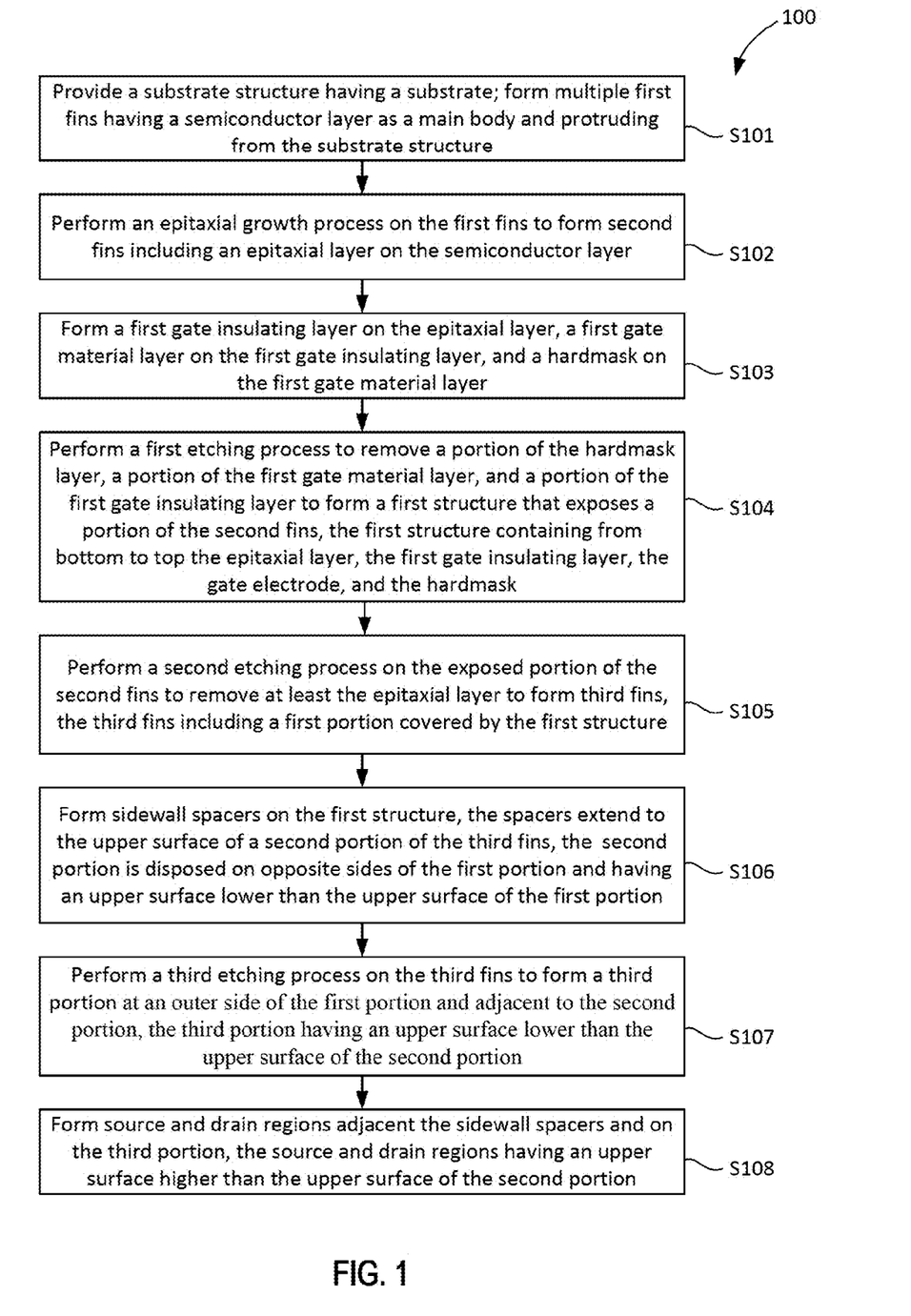
FIG. 1 is a flowchart diagram illustrating a manufacturing method according to an embodiment of the present invention.

In accordance with some embodiments of the present invention, FIG. 1 is a flowchart illustrating a method 100 for manufacturing a semiconductor device. FIGS. 2-5, 6A, 6B, 6C, 7, 8, 9A, 9B, and 10-13 are cross-sectional views of intermediate stages of the manufacturing method according to some embodiments of the present invention. In the disclosure, each drawing or block in the flowchart represents a process associated with embodiments of the method described. Those of skill in the art will recognize that additional blocks and drawings that described the embodiments may be added.

Referring to FIG. 1, in block S101, a substrate structure is provided. The substrate structure includes a substrate. A plurality of first fins protrude from the substrate structure. The fin fins include a semiconductor layer serving as a main body.

Figure 2:
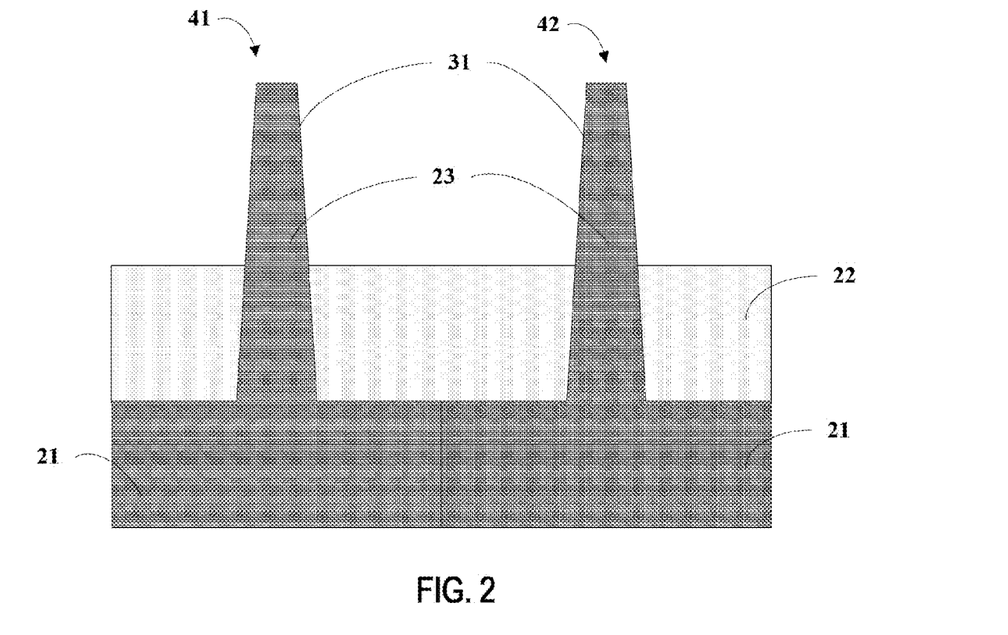
FIG. 2 is a cross-sectional view of an intermediate stage of a manufacturing method according to some embodiments of the present invention.

FIG. 2 is a cross-sectional view illustrating the substrate structure of block S101. As shown in FIG. 2, a substrate structure 20 includes a substrate (e.g., silicon) 21, a multitude of semiconductor fins (first fins) 31 protrude from the substrate structure. First fins 31 include a semiconductor layer 23 as the main body. For example, semiconductor layer 23 may be silicon (Si) or silicon germanium (SiGe).

In some embodiments, as shown in FIG. 2, first fins 31 may include a first set of fins 41 and a second set of fins 42. First set of fins 41 may be configured to form NMOS transistor devices, and second set of fins may be configured to form PMOS transistor devices. It is understood that the number of fins can be any integer number. In the example shown in FIG. 2, two fins are used, but it is understood that the number is arbitrary chosen for describing the example embodiment and should not be limiting.

In some embodiments, as shown in FIG. 2, substrate structure 20 may further include a dielectric layer (e.g., silicon dioxide) 22 on substrate 21. In this case, first fins 31 protrude from dielectric layer 22. In other words, semiconductor layer 23 may extends through dielectric layer 23 into the substrate.

Although substrate 21 is shown as a bulk silicon substrate in FIG. 2, it is understood, however, that the invention is not limited thereto. For example, substrate 21 may be an SOI substrate.

In some embodiments, the substrate structure may be formed by firstly forming a plurality of initial fins on the substrate by etching the substrate using a patterned mask.

In the case that the initial substrate is a semiconductor substrate, after the initial fins have been formed, an insulating layer (e.g., silicon dioxide) may be formed on the initial fins. Thereafter, the insulating layer is etched back to expose a portion of the initial fins.

It is to be understood that, as used herein, the term "fin" refers to a vertical structure protruding from the substrate structure, which includes the substrate or the substrate and the dielectric layer disposed thereon, however, the term "fin" may also refer broadly as the fin structure of a FinFET device.

In some embodiments, after the formation of the initial fins, a liner oxide layer may be formed on the surface of the fins using an atomic layer deposition process to repair damage caused by etching. In some embodiments, an ion implantation process may be performed into the fins to form a well region in the fins. For example, a P-type well region may be formed in the fins to form NMOS transistor devices, and an N-type well region may be formed in the fins to form PMOS transistor devices. Then, optionally, the liner oxide layer may be removed. In some embodiments, an anti-punch through (APT) implant process and an annealing process may be performed on the fins.

Referring back to FIG. 1, in block S102, an epitaxial growth process is perform to form an epitaxial grown layer on the first fins, thereby forming second fins including the semiconductor layer and the epitaxial layer.

Figure 3:
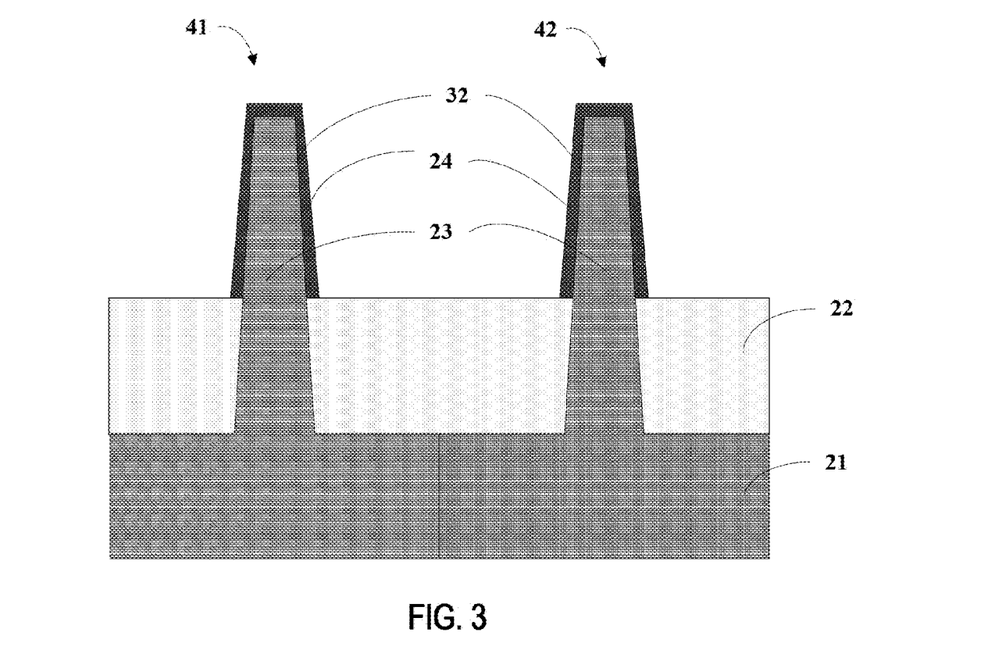
FIG. 3 is a cross-sectional view of an intermediate stage of a manufacturing method according to some embodiments of the present invention.

FIG. 3 is a cross-sectional view illustrating the substrate structure of block S102. For example, an epitaxial growth process is performed on first fins 31 to form an epitaxial layer 24, so that second fins are formed including semiconductor layer 23 and epitaxial layer 24. It is understood that the second fins are an intermediate structure. Epitaxial layer 24 may be of silicon, silicon germanium, or a III-V compound (e.g., GaAs), and the like. In some embodiments, epitaxial layer 24 has a thickness in the range between 1 nm and 2 nm.

The epitaxial growth process may be an in-situ epitaxial growth process doped with phosphorus or arsenic. For example, an N-type doped epitaxial layer may be formed on the first set of fins 41 and the second set of fins 42. However, the present invention is not limited thereto, for example, a doping process may be performed after the formation of the epitaxial layer.

In other embodiments, the in-situ doped epitaxial growth process may be performed separately on the first set of fins 41 and on the second set of fins 42. For example, an insulating layer (not shown) is formed on the second set of fins exposing the first set of fins, an in-situ epitaxial growth process doped with phosphorus or arsenic is performed on first set of fins 41. Thereafter, the insulating layer is removed. Similarly, an in-situ epitaxial growth process doped with boron is performed on second set of fins 42. Thus, an N-type doped epitaxial layer is formed on first set of fins 41, and a P-type doped epitaxial layer is formed on second set of fins 42.

In still other embodiments, a P-type doped epitaxial layer may be formed on first set of fins 41, and an N-type doped epitaxial layer may be formed on second set of fins 42.

Referring back to FIG. 1, in block S103, a first gate insulating layer is formed on the epitaxial layer, a first gate material layer is formed on the first gate insulating layer, and a hardmask layer is formed on the first gate material layer.

Figure 4:
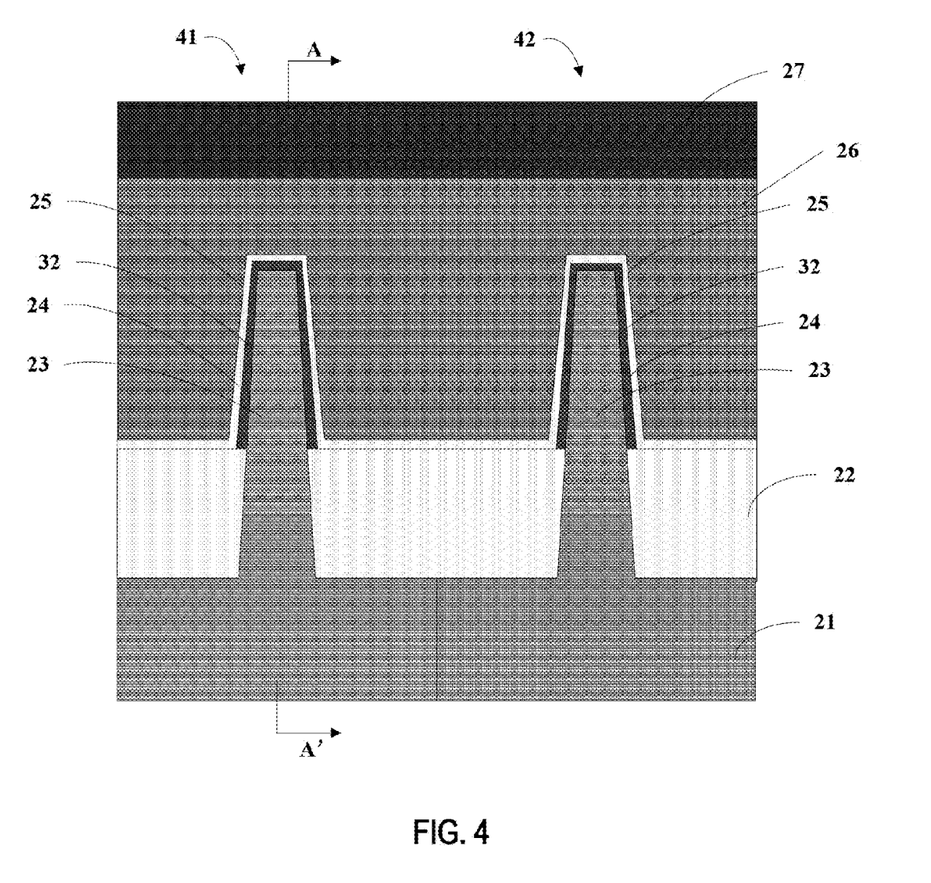
FIG. 4 is a cross-sectional view of an intermediate stage of a manufacturing method according to some embodiments of the present invention.

FIG. 4 is a cross-sectional view illustrating the substrate structure of block S103. For example, a first gate insulating layer 25 is formed on epitaxial layer 24, a first gate material layer 26 is formed on first gate insulating layer 25, and a hardmask layer 27 is formed on first gate material layer 26.

In an exemplary embodiment, a first gate insulating layer may be formed on epitaxial layer 24 using an oxidation or deposition process. Next, a gate material layer is formed on the first gate insulating layer using a deposition process. Preferably, a planarization (e.g., CMP) process is performed on the first gate material layer to obtain a planar surface of the first gate material layer, a hard mask layer is then deposited on the first gate material layer.

Referring back to FIG. 1, in block S104, a portion of the hardmask layer, a portion of the first gate material layer, and a portion of the first gate insulating layer are removed by etching using a patterned mask (not shown) as a mask to form a first structure that exposes a portion of the second fins. The first structure includes a first gate insulation material on the epitaxial layer, a first gate electrode on the first gate insulation material, and the hard mask on the first gate electrode.

Figure 5:
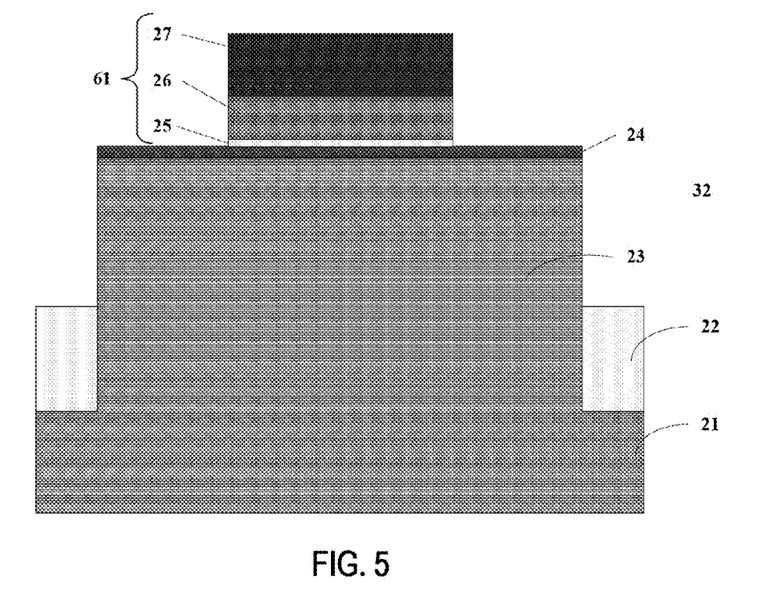
FIG. 5 is a cross-sectional view of an intermediate stage of a manufacturing method according to some embodiments of the present invention.

FIG. 5 is a cross-sectional view of FIG. 4 taken along the line AA' according to block S104. As shown in FIG. 5, hardmask layer 27, first gate material layer 26, first gate insulating layer 25 are etched using a patterned mask (e.g., a patterned photoresist) as an etching mask to form a first structure 61 and expose a portion of second fin 32 that is not covered by first structure 61. First structure 61 includes first gate insulating material 25 on epitaxial layer 24, first gate electrode 26 on first gate insulating material 25, and a hardmask 27 on first gate electrode 26. It is noted that first structure 61 is above dielectric layer 22, as is clearly shown in FIG. 6B.

It is noted that FIG. 5 illustrates a structure of first set of fins 41. Those of skill in the art will appreciate that the structure of the second set of fins may have a substantially same structure of the first set of fins following similar or substantially same processes of forming the first set of fins. In the subsequent processes, unless explicitly stated, the second set of fins may be formed similarly using substantially same processes of forming the first set of fins, and the processes will not be repeated for the sake of brevity.

Referring back to FIG. 1, in block S105, an etching process is performed on the exposed portion of the second fins to remove at least the epitaxial layer to form third fins. The third fins each include a portion covered by the first structure. For the sake of clarity, in the following description, only one fin is shown.

Figure 6A:
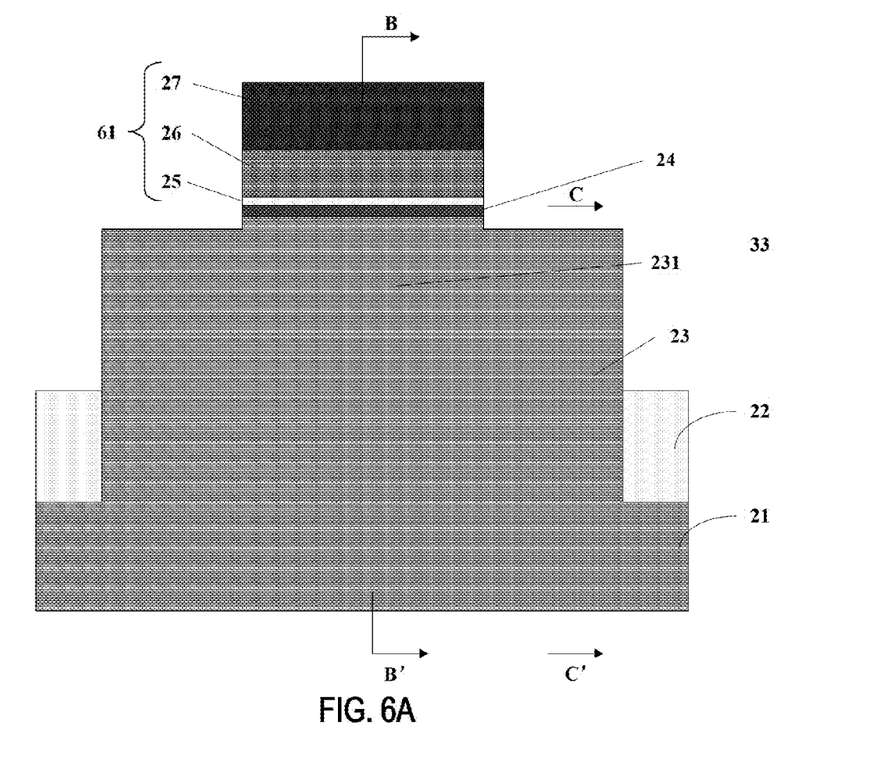
FIG. 6A is a cross-sectional view of an intermediate stage of a manufacturing method according to some embodiments of the present invention.
Figure 6B:
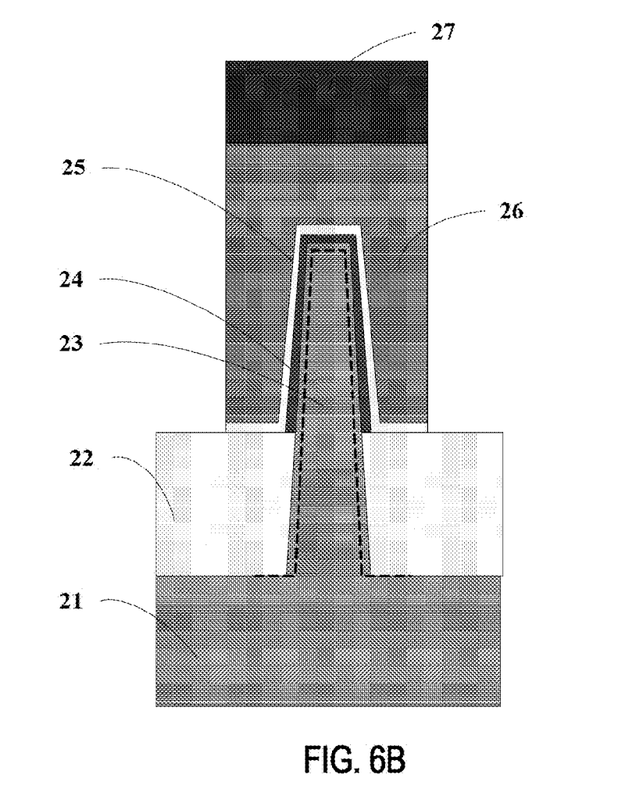
FIG. 6B is a cross-sectional view of FIG. 6A taken along the line B-B'.
Figure 6C:
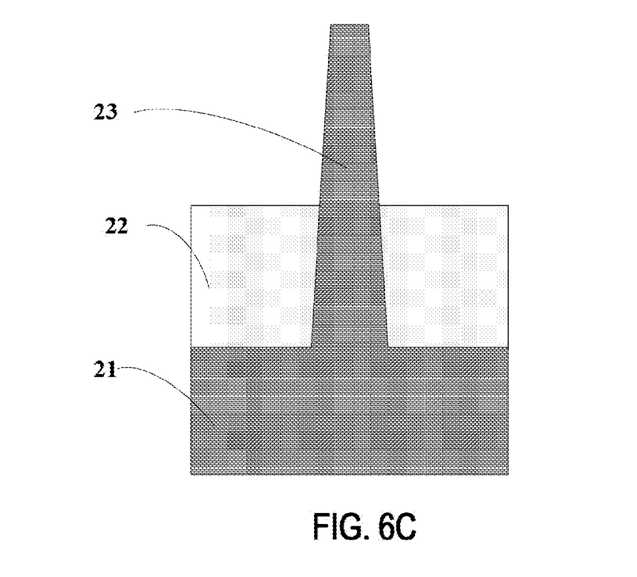
FIG. 6C is a cross-sectional view of of FIG. 6A taken along the line C-C'.

FIG. 6A is a cross-sectional view illustrating a structure according to block S105. FIGS. 6B and 6C are cross-sectional views of the structure of FIG. 6A taken along the line BB' and CC', respectively.

As shown in FIG. 6A, an etching process is performed on the exposed portion of second fin 32 to remove at least one portion of epitaxial layer 24 to form a third fin 33. Third fin 33 includes a first portion 231 of semiconductor layer 23 covered by first structure 61.

In some embodiments, the etching process removes in addition to the at least one portion of epitaxial layer 24 also a portion of semiconductor layer 23, i.e., a portion of the main body. For example, the etching process includes an over-etching step for etching a portion of the main body. In an embodiment, the etched portion of semiconductor layer 23 may have a thickness in the range between 1 nm and 3 nm. As can be seen from FIGS. 6A and 6B, a portion of the top surface and lateral surfaces of the exposed portion of the semiconductor layer are removed by the etching process, so that the exposed top surface of the semiconductor layer is lower than the first portion 231 covered by the first structure, and the width of the etched lateral surfaces of the semiconductor layer is narrower than the width of the first portion of the main body.

Through the removal of the epitaxial layer and a portion of the semiconductor layer below the epitaxial layer, the thus formed semiconductor device has the channel moved down from the vicinity of the interface between the active region and the gate dielectric layer during operation, so that the generated hot carriers do not enter the gate electrode, thereby improving the semiconductor device reliability.

Referring back to FIG. 1, in block S106, sidewall spacers are formed on sidewalls of the first structure, the sidewall spacers extend to the upper surface of a second portion of the third fin, the second portion is disposed on opposite sides of the first portion, the first portion protrudes from the second portion, and the upper surface of the second portion is lower than the upper surface of the first portion.

Figure 7:
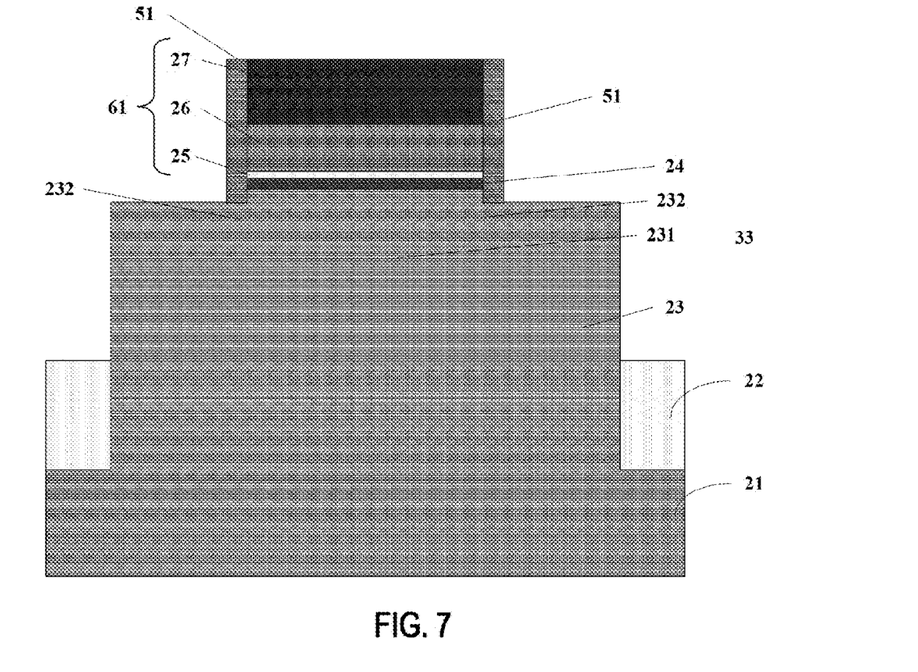
FIG. 7 is a cross-sectional view of an intermediate stage of a manufacturing method according to some embodiments of the present invention.

FIG. 7 is a cross-sectional view illustrating a structure of FIG. 6A after performing block S106. As shown in FIG. 7, sidewall spacers 51 are formed on the sidewalls of the first structure. Sidewall spacers 51 extend to cover the surface of the second portion 232 of third fin 33. Second portion 232 is disposed on opposite sides of first portion 231. First portion 231 protrudes from second portion 232. The upper surface of second portion 232 is lower than the upper surface of first portion 231.

Referring back to FIG. 1, in block S107, an etching process is performed on the third fin to form a third portion in the second portion with respect to the outer surface of the first portion. The upper surface of the third portion is lower than the upper surface of the second portion.

Figure 8:
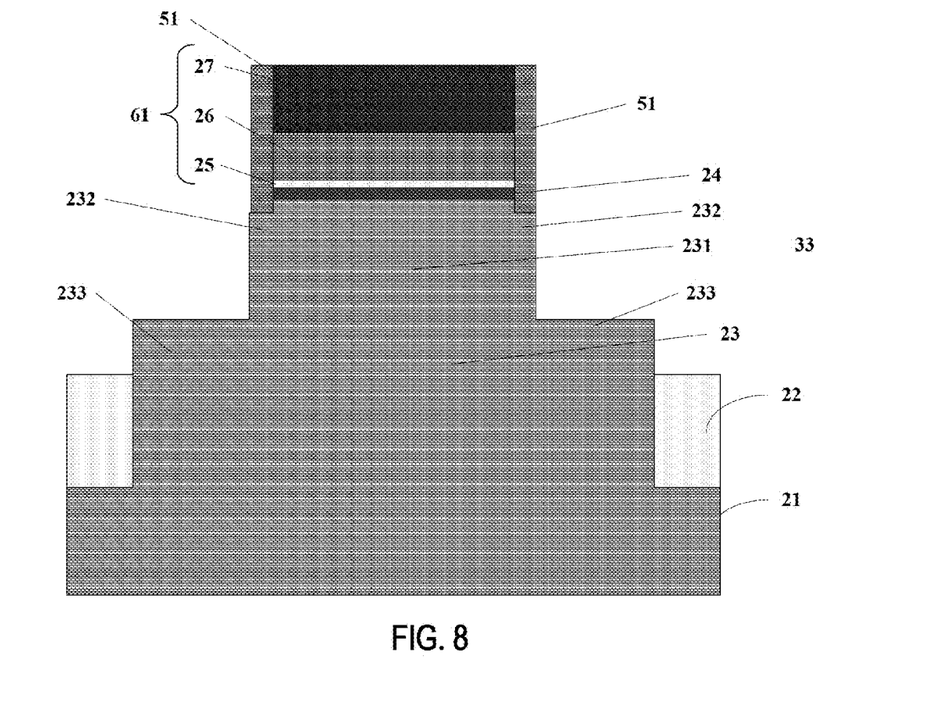
FIG. 8 is a cross-sectional view of an intermediate stage of a manufacturing method according to some embodiments of the present invention.

FIG. 8 is a cross-sectional view illustrating a structure of FIG. 7 after performing block S107. As shown in FIG. 8, an etching process is performed on third fin 33 to form a third portion 233 in second portion 232 with respect to the outer surface of first portion 231. The upper surface of third portion 233 is lower than the upper surface of second portion 232. Note that the etching process is a self-aligned etching process using first structure 61 and sidewall spacer 51 as an etching mask.

Referring back to FIG. 1, in block S108, a source region and a drain region are epitaxially formed on the third portion at an outer side of the sidewall spacers of the first structure, the upper surface of the source and drain regions is higher than the upper surface of the second portion.

Figure 9A:
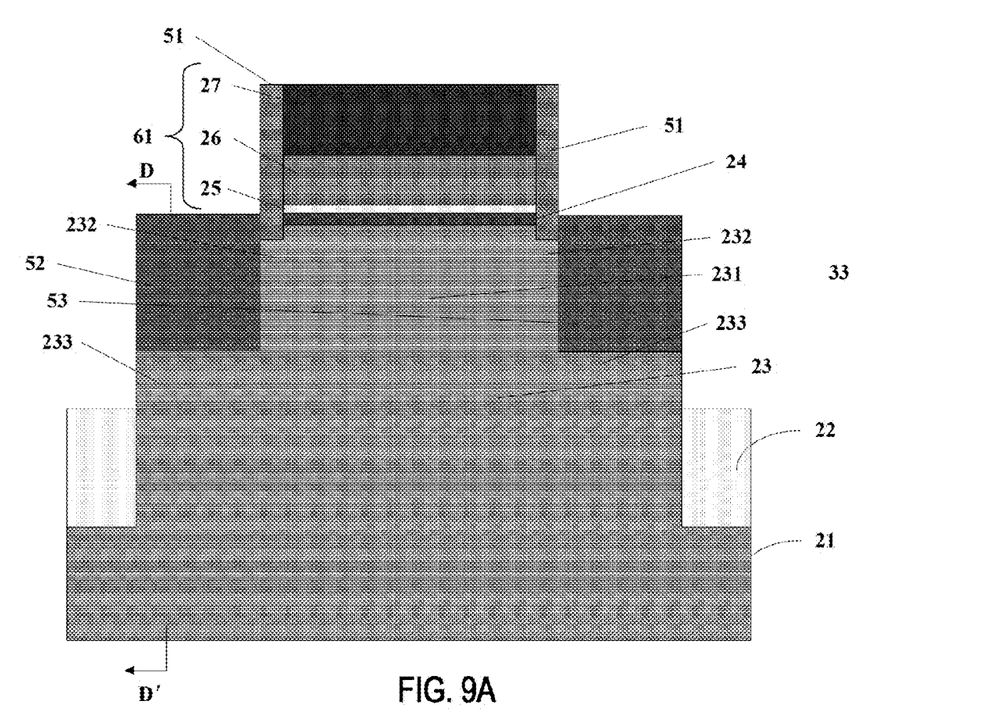
FIG. 9A is a cross-sectional view of an intermediate stage of a manufacturing method according to some embodiments of the present invention.
Figure 9B:
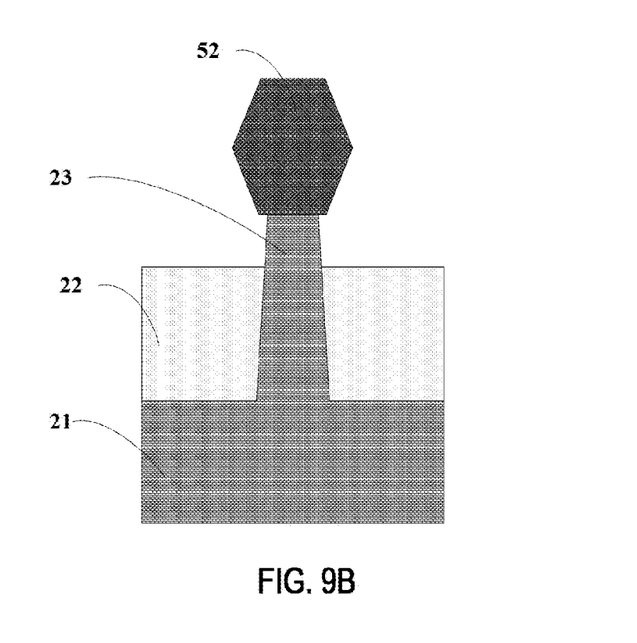
FIG. 9B is a cross-sectional view of FIG. 9A taken along the line D-D'.

FIG. 9A is a cross-sectional view illustrating a structure of FIG. 8 after performing block S108. FIG. 9B is a cross-sectional view of the structure of FIG. 9A taken along the line DD'. As shown in FIGS. 9A and 9B, a source region 52 and a drain region 53 are epitaxially formed on third portion 233 and adjacent sidewall spacers 51 outside first structure 61. The upper surface of source region 52 and drain region 53 is higher than the upper surface of second portion 232.

In some embodiments, semiconductor layer 23 includes silicon, source and drain regions 52, 53 include SiGe or SiP. That is, different materials can be epitaxially grown on third portion 233 to form source region 52 and drain region 53. The epitaxially formed source and drain regions have polygonal cross-sectional shapes (e.g., a hexagonal shape), as shown in FIG. 9B.

In some embodiments, the source and drain regions of the first set of fins may include SiP, and the source and drain regions of the second set of fins may include SiGe.

Thus, the above-described embodiments of the present invention provide a method for manufacturing a semiconductor device. By shifting the channel region with respect to the sidewall spacers (with respect to the lower portion of the sidewall spacers or with respect to the channel location), the channel is moved down from the interface of the active region and the gate insulating layer, so that the generated hot carriers during operations are further away from the interface so that they do not enter the gate electrode, thereby improving the reliability of the semiconductor device.

Figure 10:
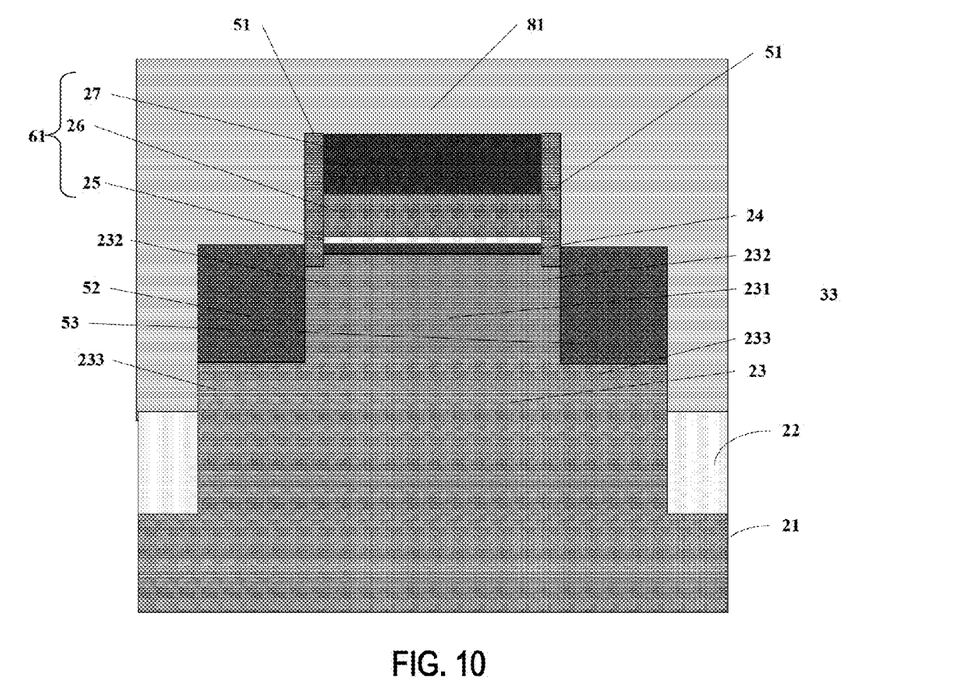
FIG. 10 is a cross-sectional view of an intermediate stage of a manufacturing method according to some embodiments of the present invention.

According to some embodiments of the present invention, method 100 may further include the following process steps:

Referring to FIG. 10, an interlayer dielectric layer 81 is formed on first structure 61. Interlayer dielectric layer 81 may include silicon dioxide.

Figure 11:
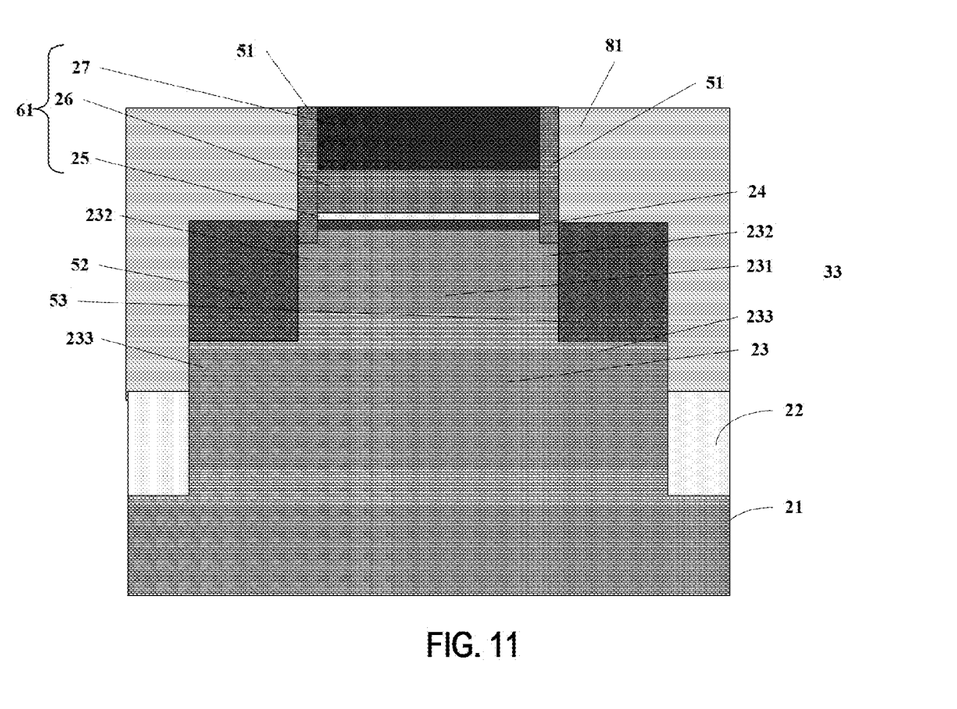
FIG. 11 is a cross-sectional view of an intermediate stage of a manufacturing method according to some embodiments of the present invention.

Next, interlayer dielectric layer 81 is etched back to expose a surface of hardmask layer 27, as shown in FIG. 11. For example, a planarization (CMP) process may be performed on interlayer dielectric layer 81 to expose a surface of hardmask layer 27.

Figure 12:
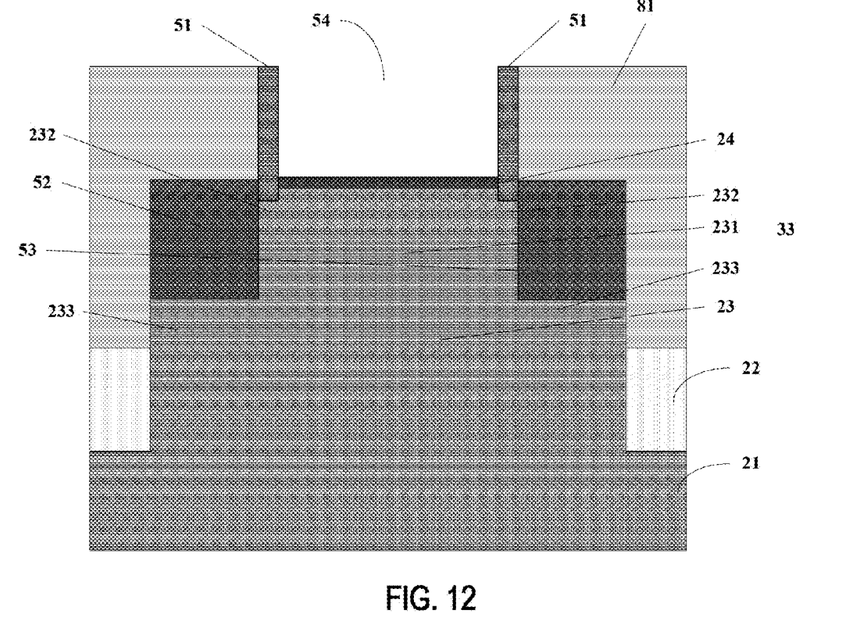
FIG. 12 is a cross-sectional view of an intermediate stage of a manufacturing method according to some embodiments of the present invention.

Next, hardmask layer 27, first gate electrode 26, and first gate insulating layer 25 are removed to form a trench 54, as shown in FIG. 12.

Figure 13:
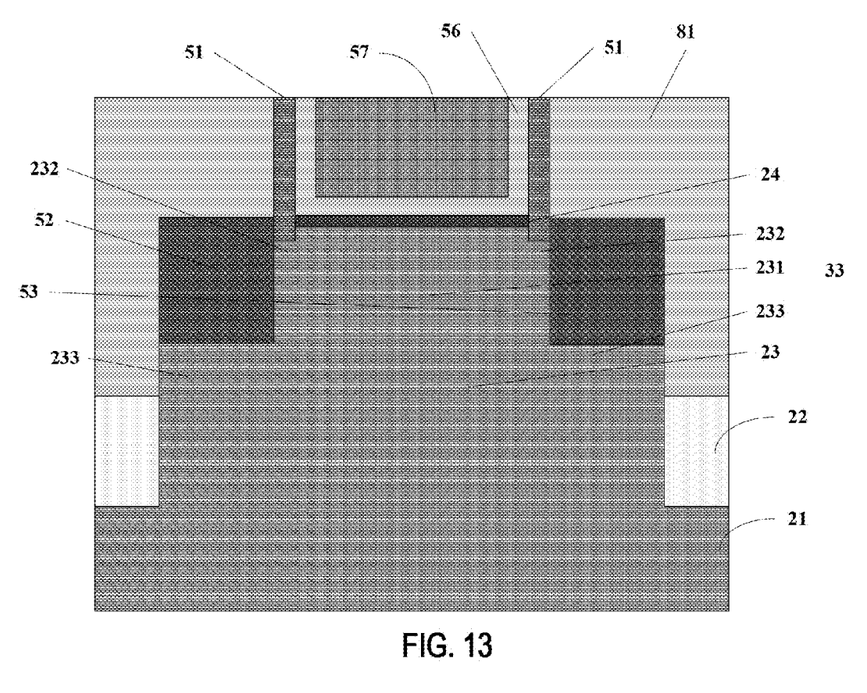
FIG. 13 is a cross-sectional view of an intermediate stage of a manufacturing method according to some embodiments of the present invention.

Next, a gate structure is formed in trench 54, as shown in FIG. 13. In some embodiments, the gate structure may include a second gate insulating layer 56 on first portion 231, and a second gate electrode 57 on second gate insulating layer 56. In an exemplary embodiment, the second gate electrode may include a metal (e.g., copper, aluminum, tungsten, or the like), or a metal compound (e.g., tantalum nitride).

In some embodiments, the second gate insulating layer may include an interface layer (e.g., a silicon oxide layer) on the first portion, and a high-k dielectric layer on the interface layer. The second gate electrode is formed on the high-k dielectric layer.

Thus, embodiments of the present invention provide a method for manufacturing a semiconductor device. Based on processes described in blocks S101 through S108, a gate structure is formed. For an NMOS device, when the inversion layer is formed in the channel between the source and drain regions, an accumulation layer is generated on the inversion layer. Hot carriers may be generated at the side of the drain region and move much deeper below the gate insulating layer by the accumulation layer, thereby reducing the probability that hot carriers enter the gate insulating layer, so that the reliability of the semiconductor device is improved.

Embodiments of the present invention also provide a semiconductor device. Referring to FIG. 13, a semiconductor device includes a substrate structure having a substrate 21, and a plurality of semiconductor fins 33 (i.e., third fin 33 described in above sections) each including a semiconductor layer 23. The semiconductor fin 33 includes a first portion 231, a second portion 232 disposed on opposite sides of first portion 231, and a third portion 233 disposed at the outer side of first portion 231 and adjacent second portion 232. First portion 231 protrudes from second portion 232, the upper surface of second portion 232 is lower than the upper surface of first portion 231, and the upper surface of third portion 233 is lower than the upper surface of second portion 232.

The semiconductor device also includes a gate structure on an upper surface of first portion 231, sidewall spacers 51 on opposite sides of the gate structure, and a source region 52 and a drain region 53 on third portion 233 and at the outer side of sidewall spacers 51. The upper surface of the source and drain regions is higher than the upper surface of second portion 232. The sidewall spacers are disposed on the upper surface of second portion 232.

Referring still to FIG. 13, the gate structure may include a gate insulating layer 56 on first portion 231 of semiconductor layer 23 and a gate electrode 57 on the gate insulating layer. The gate electrode may include polysilicon, metal (e.g., copper, aluminum, tungsten), and/or electrically conductive functional layer. The conductive functional layer may include a metal and a metal compound chosen from a metal nitride (e.g., tantalum nitride).

In some embodiments, the gate insulating layer may include an interface layer (e.g., silicon oxide layer) on a portion of the first portion and a high-k dielectric layer on the interface layer. The gate electrode is disposed on the high-k dielectric layer.

In some embodiments, first portion 231 may include an epitaxial layer 24, which is adjacent to the gate structure.

In some embodiments, first portion 231 protrudes from the lateral surfaces and the upper surface of the second portion.

In some embodiments, the plurality of fins may include a first set of fins configured to form NMOS transistor devices and a second set of fins configured to form PMOS transistor devices. FIG. 13 only illustrates one set of fins, however, those of skill in the art will appreciate that a second set of fins have the same or substantially the same structure.

In some embodiments, the portion (e.g., epitaxial layer 24) of the first portion of the first set of fins protruding from the second portion includes an N-type conductive material; and the portion of the first portion of the second set of fins protruding from the second portion includes an N-type conductive material.

In some embodiments, the portion of the first portion of the first set of fins protruding from the second portion includes a P-type conductive material; and the portion of the first portion of the second set of fins protruding from the second portion includes an N-type conductive material.

In some embodiments, the portion of the first portion protruding from the second portion has a thickness in the range between 1 nm and 5 nm. In some embodiments, epitaxial layer 24 has a thickness in the range between 1 nm and 2 nm.

In some embodiments, the semiconductor layer 23 of the fins includes silicon or SiGe, and the source and drain regions may include SiGe or SiP.

In some embodiments, the semiconductor layer 23 of the fins includes silicon or SiGe, the source and drain regions of the first set of fins include SiP, and the source and drain regions of the second set of fins include SiGe.

Referring still to FIG. 13, the substrate structure may further include a dielectric layer 22 on substrate 21. The fins 33 protrude from the dielectric layer, and the gate structure is on the dielectric layer.

Referring still to FIG. 13, the semiconductor device may also include an interlayer dielectric layer 81 on the substrate structure. Interlayer dielectric layer 81 surrounds the sidewall spacers 51 and the gate structure.

In accordance to embodiments of the present invention, hot carriers generated during the operation of the semiconductor device can be moved further away from the gate insulating layer to prevent them from entering the gate insulating layer, thereby improving the reliability of the semiconductor device.

Preferred embodiments of the present invention have been described in detail hereinabove. It is to be understood that the scope of the invention also comprehends embodiments from those described, yet within the scope of the claims.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A semiconductor device comprising:
   a substrate structure including a substrate;
   a plurality of semiconductor fins protruding from the substrate structure, each of the semiconductor fins comprising a first portion, a second portion on opposite sides of the first portion, and a third portion at an outer side of the first portion and adjacent to the second portion, the first portion protruding from the second portion and having an upper surface, the second portion having an upper surface lower than the upper surface of the first portion, and the third portion having an upper surface lower than the upper surface of the second portion;
   a gate structure on the upper surface of the first portion;
   sidewall spacers on opposite sides of the gate structure and covering the upper surface of the second portion; and
   a source region and a drain region on the third portion and at an outer side of the sidewall spacers, the source and drain regions each having an upper surface higher than the upper surface of the second portion.

2. The semiconductor device of claim 1, wherein the first portion comprises an epitaxial layer adjacent to the gate structure.

3. The semiconductor device of claim 1, wherein the first portion protrudes from the upper surface of the second portion.

4. The semiconductor device of claim 1, wherein the plurality of fins comprises a first set of fins configured to form a plurality of NMOS transistor devices and a second set of fins configured to form a plurality of PMOS transistor devices.

5. The semiconductor device of claim 4, wherein a portion of the first portion of the first set of fins protruding from the second portion comprises an N-type conductive material, and a portion of the first portion of the second set of fins protruding from the second portion comprises an N-type conductive material.

6. The semiconductor device of claim 4, wherein a portion of the first portion of the first set of fins protruding from the second portion comprises a P-type conductive material, and a portion of the first portion of the second set of fins protruding from the second portion comprises an N-type conductive material.

7. The semiconductor device of claim 4, wherein the semiconductor fins comprise silicon or silicon germanium (SiGe);
   the source and drain regions of the first set of fins comprise silicon phosphorus (SiP); and
   the source and drain regions of the second set of fins comprise SiGe.

8. The semiconductor device of claim 1, wherein a portion of the first portion protruding from the second portion has a thickness in a range between 1 nm and 5 nm.

9. The semiconductor device of claim 1, wherein the semiconductor fins comprise silicon or SiGe; and
   the source and drain regions comprise SiGe or SiP.

10. The semiconductor device of claim 1, wherein the substrate structure further comprises a dielectric layer on the substrate, and the fins protrude from the dielectric layer.

11. The semiconductor device of claim 1, further comprising an interlayer dielectric layer on the substrate structure, the interlayer dielectric layer surrounding the sidewall spacers and the gate structure.

12. The semiconductor device of claim 1, wherein the gate structure comprises a gate insulating layer on the first portion and a gate electrode on the gate insulating layer.

13. The semiconductor device of claim 12, wherein the gate electrode comprises polysilicon, metal or a conductive functional layer.

14. A method for manufacturing a semiconductor device, the method comprising:
   providing a substrate structure including a substrate;
   forming a plurality of first fins having a semiconductor layer on the substrate;
   performing an epitaxial growth process on the semiconductor layer of the plurality of first fins to form a plurality of second fins having an epitaxial layer;
   forming a first gate insulating layer on the epitaxial layer, a gate material layer on the first gate insulating layer, and a hardmask layer on the gate material layer;
   performing a first etching process using a patterned mask to remove a portion of the hardmask layer, a portion of the gate material layer, and a portion of the first gate insulating layer to form a first structure and exposing a portion of the second fins not covered by the first structure;
   performing a second etching process to remove at least one portion of the epitaxial layer in the exposed portion of the second fins to form a plurality of third fins, the third fins comprising a first portion of the semiconductor layer covered by the first structure;
   forming sidewall spacers on the first structure, the sidewall spacers being disposed on an upper surface of a second portion of the third fins, the second portion being on opposite sides of the first portion and having an upper surface lower than an upper surface of the first portion;
   performing a third etching process to form a third portion at an outer side of the first portion and adjacent to the second portion, the third portion having an upper surface lower than the upper surface of the second portion; and
   forming a source region and a drain region outside of the sidewall spacers and on the third portion, the source and drain regions each having an upper surface higher than the upper surface of the second portion.

15. The method of claim 14, further comprising:
   forming an interlayer dielectric layer on the first structure;
   etching back the interlayer dielectric layer to expose the hardmask layer;
   removing a portion of the hardmask layer, a portion of the gate electrode, and a portion of the first gate insulating layer to form a trench; and
   forming a gate structure in the trench.

16. The method of claim 15, wherein the gate structure comprises a second gate insulating layer on the first portion, and a second gate electrode on the second gate insulating layer.

17. The method of claim 14, wherein performing the second etching process to remove the at least one portion of the epitaxial layer in the exposed portion of the second fins further comprises removing a portion of the semiconductor layer below the epitaxial layer.

18. The method of claim 17, wherein the removed portion of the semiconductor layer has a thickness in a range between 1 nm and 3 nm.

19. The method of claim 14, wherein the plurality of fins comprises a first set of fins configured to form a plurality of NMOS transistor devices and a second set of fins configured to form a plurality of PMOS transistor devices.

20. The method of claim 14, wherein the epitaxial growth process is an in-situ epitaxial growth process doped with phosphorus or arsenic.

* * * * *